(12) United States Patent
Li et al.

(10) Patent No.: US 10,336,875 B2
(45) Date of Patent: Jul. 2, 2019

(54) HALOGEN-FREE RESIN COMPOSITION AND PREPREG AND LAMINATE PREPARED THEREFROM

(71) Applicant: SHENGYI TECHNOLOGY CO., LTD., Dongguan, Guangdong (CN)

(72) Inventors: Hui Li, Dongguan (CN); Kehong Fang, Dongguan (CN)

(73) Assignee: SHENGYI TECHNOLOGY CO., LTD., Dongguan, Guangdong (CN)

( * ) Notice: Subject to any disclaimer, the term of this patent is extended or adjusted under 35 U.S.C. 154(b) by 177 days.

(21) Appl. No.: 15/525,884

(22) PCT Filed: Dec. 2, 2014

(86) PCT No.: PCT/CN2014/092842
§ 371 (c)(1),
(2) Date: May 10, 2017

(87) PCT Pub. No.: WO2016/074291
PCT Pub. Date: May 19, 2016

(65) Prior Publication Data
US 2018/0327558 A1 Nov. 15, 2018

(30) Foreign Application Priority Data
Nov. 11, 2014 (CN) .......................... 2014 1 0633018

(51) Int. Cl.
| | | |
|---|---|---|
| *B32B 27/38* | (2006.01) | |
| *B32B 27/04* | (2006.01) | |
| *C08J 5/24* | (2006.01) | |
| *C08L 63/00* | (2006.01) | |
| *C08G 59/32* | (2006.01) | |
| *C08G 59/38* | (2006.01) | |
| *C08G 59/42* | (2006.01) | |
| *H05K 1/03* | (2006.01) | |
| *B32B 5/02* | (2006.01) | |
| *B32B 27/12* | (2006.01) | |
| *B32B 15/092* | (2006.01) | |
| *C09D 163/00* | (2006.01) | |
| *C09J 163/00* | (2006.01) | |

(52) U.S. Cl.
CPC ............... *C08J 5/24* (2013.01); *B32B 5/022* (2013.01); *B32B 5/024* (2013.01); *B32B 27/04* (2013.01); *B32B 27/12* (2013.01); *B32B 27/38* (2013.01); *C08L 63/00* (2013.01); *H05K 1/038* (2013.01); *H05K 1/0373* (2013.01); *B32B 2255/02* (2013.01); *B32B 2255/26* (2013.01); *B32B 2262/101* (2013.01); *B32B 2457/08* (2013.01); *C08J 2363/00* (2013.01); *C08J 2435/06* (2013.01); *C08J 2471/12* (2013.01); *C08J 2479/04* (2013.01); *C08L 2201/02* (2013.01); *H05K 2201/012* (2013.01); *H05K 2201/029* (2013.01); *H05K 2201/0209* (2013.01)

(58) Field of Classification Search
None
See application file for complete search history.

(56) References Cited

U.S. PATENT DOCUMENTS

| | | | | |
|---|---|---|---|---|
| 2004/0147640 A1* | 7/2004 | Hwang | ................ | C08G 59/304 |
| | | | | 523/400 |
| 2011/0089549 A1* | 4/2011 | Zenbutsu | .............. | H01L 21/565 |
| | | | | 257/676 |
| 2013/0161080 A1* | 6/2013 | Lin | ........................ | C08L 79/04 |
| | | | | 174/257 |
| 2013/0316155 A1* | 11/2013 | Li | .......................... | C08L 63/00 |
| | | | | 428/209 |
| 2014/0107256 A1 | 4/2014 | Su | | |
| 2017/0253013 A1* | 9/2017 | Li | .......................... | B32B 27/04 |

FOREIGN PATENT DOCUMENTS

| | | | | |
|---|---|---|---|---|
| CN | 102119184 | | 7/2011 | |
| CN | 102732029 | | 10/2012 | |
| CN | 102964775 | | 3/2013 | |
| CN | 103131131 | | 6/2013 | |
| CN | 103265810 | | 8/2013 | |
| CN | 103421273 | | 12/2013 | |
| CN | 103980708 | | 8/2014 | |
| JP | 2011074123 A | * | 4/2011 | ............. C08L 63/00 |
| KR | 20140067005 | | 6/2014 | |
| TW | 201100488 | | 1/2011 | |
| WO | 2014036711 | | 3/2014 | |

OTHER PUBLICATIONS

Machine translation of JP-2011074123-A (no date).*

* cited by examiner

*Primary Examiner* — Michael J Feely
(74) *Attorney, Agent, or Firm* — Workman Nydegger

(57) ABSTRACT

A halogen-free resin composition and a prepreg and a laminate prepared therefrom. The halogen-free resin composition comprises the following ingredients in parts by weight: 50-100 parts of an epoxy resin, 20-70 parts of benzoxazine, 5-40 parts of polyphenyl ether, 5-30 parts of styrene-maleic anhydride, 5-40 parts of a halogen-free flame retardant, 0.2-5 parts of a curing accelerator, and 20-100 parts of a filler. The prepreg and the laminate, which are manufactured from the halogen-free resin composition, have the comprehensive properties of low dielectric constant, low dielectric loss, excellent heat resistance, adhesive property and wet resistance and the like, and are suitable for being applied to halogen-free high-frequency multilayer circuit boards.

19 Claims, No Drawings

HALOGEN-FREE RESIN COMPOSITION AND PREPREG AND LAMINATE PREPARED THEREFROM

TECHNICAL FIELD

The present invention relates to the technical field of laminates, specifically involves a resin composition, especially a halogen-free resin composition and a prepreg, a laminate and a printed circuit board prepared therefrom.

BACKGROUND ART

At present, halogen-containing flame retardants (especially brominated flame retardants) are widely used in polymer flame retardant materials, and play a better flame retardant effect. However, it is concluded after the in-depth study of the fire scene that, although the halogen-containing flame retardant has a better flame retardant effect and a small addition amount, the polymer material containing the halogen-containing flame retardant will produce a lot of toxic and corrosive gas and smoke which suffocate people, thereby being more harmful than the fire itself. As a result, the development of the halogen-free flame retardant printed circuit boards has become a key point in the industry with the formal implementations of the EU Waste Electrical and Electronic Equipment Directive and the Restriction of the Use of Certain Hazardous Substances in Electrical and Electronic Equipment on Jul. 1, 2006. The CCL manufacturers have launched their own halogen-free flame retardant copper clad laminate.

Currently, phosphorus-containing resin is widely used in the industry to realize flame-retardant effect. But the introduction of too much phosphorus will make the water absorption of the substrate become high and the chemical resistance become worse. In recent years, the development of benzoxazine as a matrix resin for halogen-free substrate gets more and more attention. Benzoxazine is a benzo six-membered heterocyclic ring system composed of oxygen atoms and nitrogen atoms. It has the characteristics of ring-opening polymerization. When being polymerized, there is no release of small molecules. After polymerization, it is formed into a network structure similar to phenolic resin. The products thereof have small curing shrinkage, low porosity, excellent mechanical, electrical and flame retardant properties.

On the other aspect, with the rapid development of the electronics industry, electronic products tend to be light, thin, short, high density, security and high functionality, requiring electronic components to have higher signal transmission speed and transmission efficiency, which makes higher performance requirements on the printed circuit board as the carrier. Due to high speed and multi-functionalization of electronic product information processing, the application frequency is continually increased, and 3 GHz or more will gradually become mainstream, therefore, besides maintaining the higher requirements on heat resistance of laminate materials, dielectric constant and dielectric loss value will be required to be lower and lower.

The current traditional FR-4 is difficult to meet the application demand on high frequency and rapid development of electronic products. Meanwhile, the substrate material no longer plays the traditional mechanical support role, and will become together with the electronic components an important way to improve product performances for PCB and designers of terminal manufacturers.

Because high dielectric constant (Dk) will slow down the signal transmission rate, and high dielectric loss (DO will convert the signal partly into heat loss in the substrate material, high-frequency transmission with low dielectric constant and low dielectric loss, especially the development of halogen-free high-frequency plates, has become the focus of copper clad laminate industry.

In order to solve the above-mentioned problems, CN101684191B discloses that a cured product can be obtained by co-curing epoxy resin by using benzoxazine, styrene-maleic anhydride and phosphorus-containing curing agent. But there will inevitably be many other aspects of problems by reducing the dielectric properties of the material using only styrene-maleic anhydride. The impact on adhesion is particularly significant because the non-polar styrene structural unit in the molecular structure of styrene-maleic anhydride (SMA) decreases the polarity of the matrix resin, weakens the interaction between the resin and copper foil. At the same time, the large amount of benzene ring structure in SMA increases the brittleness of the resin crosslinking network, and also has adverse effect on the bonding performance under dynamic conditions, thereby reducing the bonding strength between the substrates and between the substrate and copper foils.

CN100523081C discloses that a cured product having a lower dielectric constant and dielectric loss can be obtained by co-curing phosphorus-containing epoxy resin with benzoxazine, styrene-maleic anhydride and other curing agents. However, although phosphorus-containing epoxy resin as the matrix resin can achieve excellent flame retardancy, the introduction of too much phosphorus will necessarily have a great impact on the water absorption of the substrate, which will certainly have negative impact on many other properties of the sheets.

CN103131131A discloses that a cured product having a lower dielectric constant and dielectric loss can be obtained by co-curing epoxy resin with benzoxazine, styrene-maleic anhydride and amine curing agent. Although ordinary benzoxazine can achieve the objects of curing epoxy resin and flame retardancy, it has a higher dielectric constant and is hard to meet the high-frequency high-speed transmission. Moreover, though the introduction of amine curing agent can enhance the adhesion property, the deficiencies of higher hygroscopicity and insufficient heat resistance for curing epoxy resin will necessarily have adverse effect on the use in high multi-layer circuit boards.

Therefore, it is an urgent problem to be solved how to produce prepregs and laminates having low dielectric constant, low dielectric loss and excellent chemical resistance.

DISCLOSURE OF THE INVENTION

The present invention aims to provide a resin composition, especially a halogen-free resin composition and a prepreg, a laminate and a printed circuit board prepared therefrom.

In order to achieve the object, the present invention uses the following technical solution.

On one aspect, the present invention provides a halogen-free resin composition comprising the following components in parts by weight: 50-100 parts of an epoxy resin, 20-70 parts of benzoxazine, 5-40 parts of a polyphenyl ether, 5-30 parts of styrene-maleic anhydride, 5-40 parts of a halogen-free flame retardant, 0.2-5 parts of a curing accelerator, and 20-100 parts of a filler.

The epoxy resin of the present invention at least comprises an epoxy resin having the dicyclopentadiene alkyl structure as shown in the following chemical structural formula:

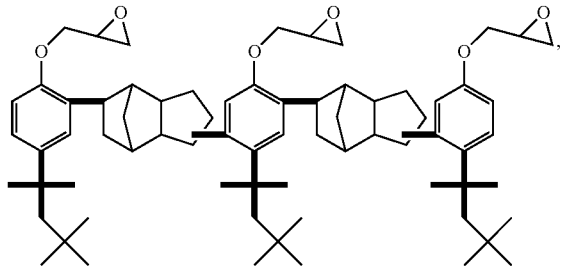

Said epoxy resin is also anyone selected from the group consisting of bisphenol A type epoxy resin, bisphenol F type epoxy resin, biphenyl epoxy resin, alkyl novolac epoxy resin, dicyclopentadiene epoxy resin, bisphenol A type novolac epoxy resin, o-cresol type novolac epoxy resin, phenol type novolac epoxy resin, trifunctional epoxy resin, tetrafunctional epoxy resin, isocyanate modified epoxy resin, naphthalene type epoxy resin and phosphorus-containing epoxy resin, or a mixture of at least two selected therefrom.

In the present invention, the epoxy resin is in an amount of 50-100 parts by weight, e.g. 50, 55, 60, 65, 70, 75, 80, 85, 90, 95, 100 parts by weight, preferably 50-90 parts by weight, further preferably 50 parts by weight.

The epoxy resin composition of the present invention contains an epoxy resin having a dicyclopentadiene alkylphenol structure, which contributes to lowering the dielectric properties of the substrate. Meanwhile, the alkyl structure not only further optimizes the dielectric properties, but also greatly reduces the water absorption of the substrate.

The benzoxazine of the present invention is anyone selected from the group consisting of fluorinated benzoxazine resin, aliphatic benzoxazine resin and dicyclopentadiene benzoxazine resin, or a mixture of at least two selected therefrom.

The fluorinated benzoxazine resin of the present invention is anyone selected from the group of the following chemical formulae, or a mixture of at least two selected therefrom:

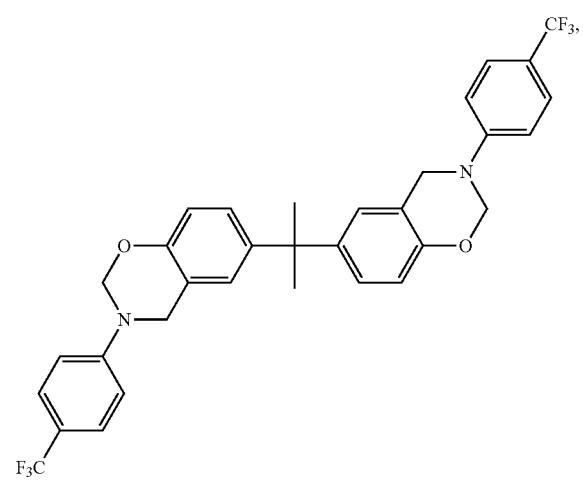

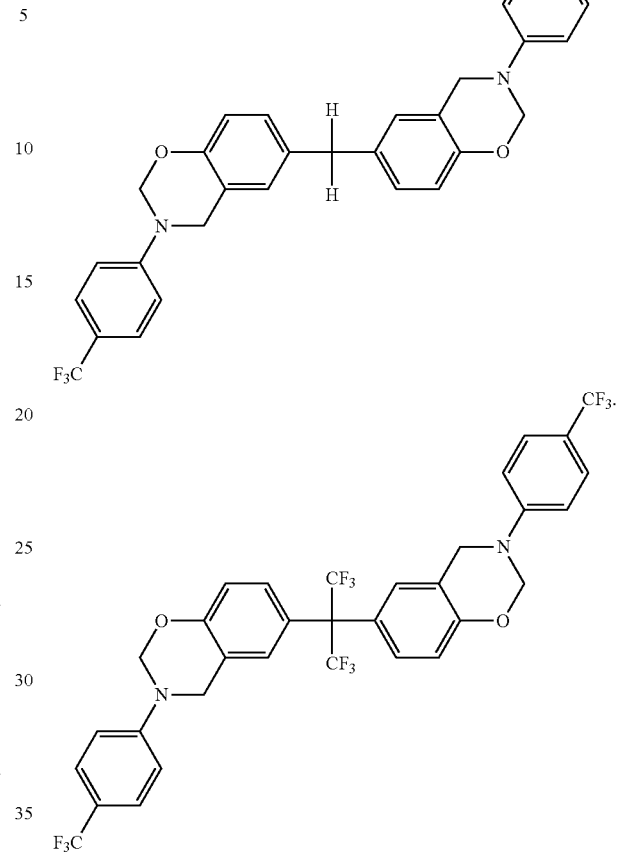

The aliphatic benzoxazine resin has the chemical structural formula of:

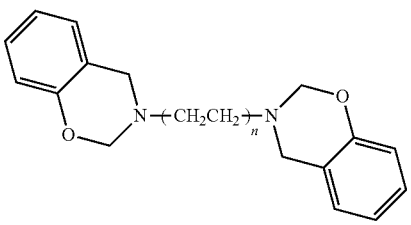

wherein n is 2 or 3.

The dicyclopentadiene benzoxazine resin has the chemical structural formula of:

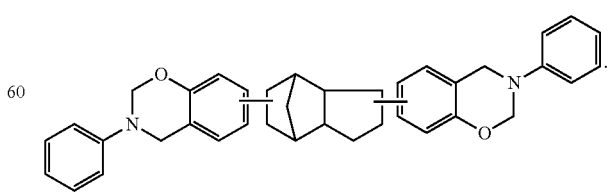

The benzoxazine resin of the present invention is in an amount of 20-70 parts by weight, e.g. 20, 25, 30, 35, 40, 45, 50, 55, 60, 65, 70, preferably 40-50 parts by weight, further preferably 45 parts by weigh.

In the present invention, said polyphenyl ether has a low molecular weight and has a number-average molecular weight of 1000-4000.

In the present invention, said polyphenyl ether is in an amount of 5-40 parts by weight, e.g. 5, 10, 15, 20, 25, 30, 35, 40 parts by weight, preferably 25 parts by weight.

The styrene-maleic anhydride of the present invention has the chemical structural formula of:

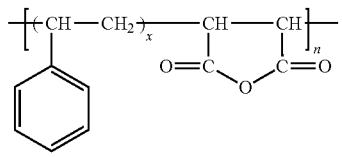

wherein x is 1-4, 6 and 8; n is 1-12; x and n both are integers.

The styrene-maleic anhydride of the present invention is in an amount of 5-30 parts by weight, e.g. 5, 10, 15, 17, 20, 22, 25 and 30 parts by weight, preferably 10-20 parts by weight, further preferably 20 parts by weight.

The present invention discloses co-curing the epoxy composition with styrene-maleic anhydride and benzoxazine, so as to make the substrate have a low dielectric constant and dielectric loss, better heat resistance and moisture resistance.

The halogen-free flame retardant of the present invention can be anyone selected from the group consisting of phosphazene, ammonium polyphosphate, tri-(2-carboxyethyl)-phosphine, tri-(isopropylchloro)phosphate, trimethyl phosphate, dimethyl-methyl phosphate, resorcinol bis-xylyl phosphate, phosphorus-nitrogen compounds, melamine polyphosphate, melamine cyanurate, tri-hydroxyethyl isocyanurate, 9,10-dihydro-9-oxa-10-phosphaphenanthrene-10-oxide and DOPO-containing novolac resin, or a mixture of at least two selected therefrom.

The halogen-free flame retardant of the present invention is in an amount of 5-40 parts by weight, e.g. 5, 10, 15, 20, 25, 30, 35, 40 parts by weight, preferably 20-22 parts by weight, further preferably 22 parts by weight.

The present invention discloses using benzoxazine having flame retardancy as the main curing agent and a small amount of phosphorus-containing flame retardant, which not only realize synergistic flame-retardant effect of phosphorus and nitrogen, but also greatly improve the flame retardancy of the substrate while greatly reducing the phosphorus content in the components, and make the substrate have good moisture resistance.

The curing accelerator of the present invention may be an imidazole accelerator, which is anyone selected from the group consisting of 2-methylimidazole, undecyl imidazole, 2-ethyl-4-methylimidazole, 2-phenyl-imidazole, and 1-cyanoethyl substituted imidazole, or a mixture of at least two selected therefrom.

The curing accelerator of the present invention is in an amount of 0.2-5 parts by weight, e.g. 0.2, 0.5, 1, 2, 3, 4 or 5 parts by weight.

The filler of the present invention can be an inorganic or organic filler. When the filler is an inorganic filler, said filler can be an inorganic filler, which is anyone selected from the group consisting of aluminum hydroxide, alumina, magnesium hydroxide, magnesium oxide, aluminum oxide, silicon dioxide, calcium carbonate, aluminum nitride, boron nitride, silicon carbide, titanium dioxide, zinc oxide, zirconium oxide, mica, boehmite, calcined talc, talc powder, silicon nitride and calcined kaolin, or a mixture of at least two selected therefrom. When the filler is an organic filler, said filler is an organic filler, which is anyone selected from the group consisting of polytetrafluoroethylene powder, polyphenylene sulfide and polyethersulfone powder, or a mixture of at least two selected therefrom.

The silicon dioxide of the present invention may be crystalline, molten or spherical silicon dioxide.

The filler of the present invention has a particle size of 0.01-50 μm, e.g. 0.01 μm, 0.05 μm, 1 μm, 5 μm, 10 μm, 15 μm, 20 μm, 25 μm, 30 μm, 40 μm, 50 μm, preferably 1-15 μm.

The filler of the present invention is in an amount of 20-100 parts by weight, e.g. 20, 30, 40, 50, 60, 70, 80, 90 or 100 parts by weight, preferably 50 parts by weight.

In order to homogeneously disperse the filler in the resin composition of the present invention, a dispersant may be added in the form of an aminosilane coupling agent or an epoxy silane coupling agent to improve the binding performance between inorganic and woven glass cloth, so as to achieve the purpose of homogeneous dispersion. Moreover, such coupling agent contains no heavy metal, and will not have adverse effects on human bodies. Such coupling agent is in an amount of 0.5-2 wt. % of the filler. If the amount thereof is too high, it will speed up the reaction and affect the storage time. If the amount thereof is too small, there is no significant effect on the improvement of the bonding stability.

On the second aspect, the present invention provides a prepreg prepared from the halogen-free resin composition as stated in the first aspect of the present invention, wherein said prepreg comprises a matrix material and the halogen-free resin composition attached thereon after impregnation and drying.

The matrix material of the present invention is a nonwoven or woven glass fiber cloth.

On the third aspect, the present invention further provides a laminate comprising the prepreg as stated in the second aspect of the present invention.

On the fourth aspect, the present invention further provides a printed circuit board comprising the laminate as stated in the third aspect of the present invention.

As compared to the prior art, the present invention has the following beneficial effects.

The laminates prepared from the halogen-free resin composition of the present invention have a low dielectric constant which can be controlled below 3.7 and a dielectric loss, the maximum value of which is 0.0057, the flame retardancy thereof can reach the V-0 standard in the flame retardant test UL-94, and the PCT water absorption thereof is 0.27-0.30. While ensuring halogen-free flame retardancy, the laminates have a low dielectric constant, a low dielectric loss, excellent heat resistance, cohesiveness, moisture resistance and other comprehensive properties, and are suitable for the use in halogen-free high-frequency multi-layer circuit boards.

EMBODIMENTS

The technical solution of the present invention will be further described below by the specific embodiments.

Those skilled in the art shall know that the examples are merely illustrative of the present invention and should not be construed as specifically limiting the present invention.

Preparation Example: Synthesis of
Dicyclopentadiene Alkyl Phenol Epoxy Resin 270.0 g of p-(1,1,3,3-tetramethyl)butylphenol was added into a four-necked flask (500 mL) equipped with a polytetrafluoroethylene stirrer, a thermometer and a reflux condenser, heated and dissolved in water bath. 1.83 g of boron trifluoride.diethyl ether was added into the 500 mL four-necked flask, and 50.1 g of dicyclopentadiene was added to a dropping funnel to control the dropping speed so that all the dicyclopentadiene was added dropwise within 2 h. The mixture was heated to 100° C., held for 4 h, cooled to room temperature, and then heated to a certain temperature to distill excess dicyclopentadiene and p-(1,1,3,3-tetramethyl) butylphenol. The product is dicyclopentadiene alkyl phenol resin.

The dicyclopentadiene alkyl phenol resin obtained in the previous step was placed in a four-necked flask. 100.0 g of epichlorohydrin was weighed, added slowly, dissolved and heated. 1 mol of KOH solution having a mass fraction of 33% was added to a dropping funnel, added dropwise within 1 h by controlling the speed. The reaction temperature was controlled at 100° C. After adding dropwise, the temperature was held for 4 h. After cooling, water-washing, heating to 120° C., excessive epichlorohydrin was distilled to obtain the epoxy resin having dicyclopentadiene alkyl phenol structure as shown in the following chemical formula:

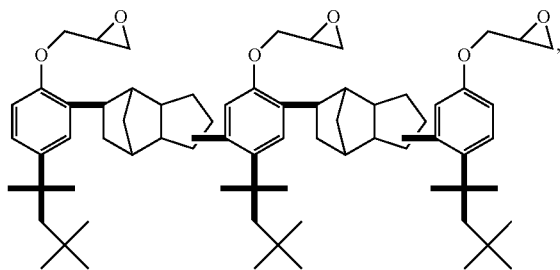

Examples: Process for Preparing Copper Clad
Laminates

An epoxy resin, benzoxazine, a polyphenyl ether, styrene-maleic anhydride, a halogen-free flame retardant, a curing accelerator, a filler and a solvent were put into a container and stirred to make the mixture uniformly into a glue. The solid content of the solution was adjusted to 60%-70% with the solvent to obtain a glue solution, i.e. a glue solution of the halogen-free resin composition of the present invention. A 2116 electronic grade glass cloth was impregnated with the glue, baked into a prepreg by an oven. 6 pieces of 2116 prepregs were covered with electrolytic copper foils having a thickness of 35 μm on both sides, vacuum-laminated in a hot press, cured at 190° C. for 120 min to obtain copper clad laminates.

The components and contents thereof (based on parts by weight) in Examples 1-9 and Comparison Examples 1-5 are shown in Table 1. The component codes and the corresponding component names are shown as follows.
(A) Epoxy resin
  (A-1) Dicyclopentadiene alkyl phenol epoxy resin synthesized in the preparation example
  (A-2) Biphenyl epoxy resin: NC-3000-H (Product name from Nippon Kayaku);
  (A-3) Dicyclopentadiene epoxy resin: HP-7200H (Product name from Dainippon Ink and Chemicals)
(B) Benzoxazine
  (B-1) Aliphatic benzoxazine resin: KAH-F5404 (Product name from Kolon)
  (B-2) Fluorinated benzoxazine: KAH-F5301 (Product name from Kolon)
  (B-3) Bisphenol F benzoxazine: LZ8280 (from Huntsman Advanced Materials)
  (B-4) Dicyclopentadiene benzoxazine: LZ8260 (from Huntsman Advanced Materials)
(C-1) Polyphenyl ether having a low molecular weight: MX90 (Product name from SABIC Innovative Plastics) having a number-average molecular weight of 1000-4000;
(C-2) Polyphenyl ether having a high molecular weight: Sabic640-111 (Product name from SABIC Innovative Plastics) having a number-average molecular weight of 15000-20000;
(D) Styrene-maleic anhydride oligomer: SMA-EF40 (Product name from Sartomer)
(E) Phosphorus-containing novolac resin: XZ92741 (Product name from DOW); (F) Curing accelerator: 2E4MZ (Product name from Shikoku Chemicals);
(H) Filler: molten silica.

The processes for preparing CCLs in Examples 1-9 and Comparison Examples 1-5 are the same as those in the examples.

The glass transition temperature (Tg), peeling strength (PS), dielectric constant (Dk) and dielectric loss angle tangent (Tg), flame retardancy, dip soldering resistance and water absorption after PCT 2 h of the copper clad laminates prepared in Examples 1-9 and Comparison Examples 1-5 were tested by the following test methods, and the test results are shown in Table 2.

The performance parameters are tested by the following methods.
  A Glass transition temperature (Tg): tested according to the DSC method as stipulated under IPC-TM-650 2.4.25 in accordance with DSC;
  B Peeling strength (PS): testing the peeling strength of the metal cover layer under the testing conditions of "after thermal stress" in the method of IPC-TM-650 2.4.8;
  C Dielectric constant (Dk) and dielectric loss angle tangent (DO: testing dielectric constant (Dk) and dielectric loss angle tangent (DO under 1 GHz by the resonance method using a stripe line according to IPC-TM-650 2.5.5.5;
  D Flame retardancy: tested according to the UL-94 standard;
  E Dip soldering resistance and water absorption after PCT 2 h:

The copper clad laminate was immersed in a copper etching solution to remove the surface copper foils, and to evaluate the substrate. The substrate was placed in a pressure cooker and treated at 121° C. and 2 atm for 2 hours. After the water absorption was measured, the substrate was immersed in a tin furnace having a temperature of 288° C. The corresponding time was recorded when the substrate is bubbled or split. The evaluation was finished when the substrate had no foaming or stratification in the tin furnace for more than 5 min.

TABLE 1

|   | Example 1 | Example 2 | Example 3 | Example 4 | Example 5 | Example 6 | Example 7 | Example 8 | Example 9 | Com. Example 1 | Com. Example 2 | Com. Example 3 | Com. Example 4 | Com. Example 5 |
|---|---|---|---|---|---|---|---|---|---|---|---|---|---|---|
| A-1 | 50 | 65 | 85 | 100 | 85 | 50 | 100 | 100 | 50 |  |  | 85 | 100 | 50 |
| A-2 |  |  |  |  |  |  | 50 |  |  | 50 |  |  |  |  |
| A-3 |  |  |  |  |  |  |  |  |  |  | 65 |  |  |  |
| B-1 | 45 | 45 | 45 | 45 |  | 45 |  |  |  | 45 | 45 |  | 45 | 45 |
| B-2 |  |  |  |  | 45 |  |  | 20 |  |  |  |  |  |  |
| B-3 |  |  |  |  |  |  |  |  |  |  |  | 45 |  |  |
| B-4 |  |  |  |  |  |  | 45 |  | 70 |  |  |  |  |  |
| C-1 | 25 | 25 | 25 | 25 | 25 | 25 | 5 | 40 |  | 25 | 25 | 25 |  |  |
| C-2 |  |  |  |  |  |  |  |  |  |  |  |  |  | 25 |
| D | 10 | 14 | 20 | 24 | 20 | 10 | 24 | 30 | 5 | 10 | 14 | 20 | 24 | 10 |
| E | 22 | 22 | 22 | 22 | 22 | 22 | 22 | 40 | 5 | 22 | 22 | 22 | 22 | 22 |
| F | q.s | q.s | q.s | q.s | q.s | q.s | q.s | q.s | q.s | q.s | q.s | q.s | q.s | q.s |
| G | 50 | 50 | 50 | 50 | 50 | 50 | 50 | 20 | 100 | 50 | 50 | 50 | 50 | 50 |

TABLE 2

| Test items | Example 1 | Example 2 | Example 3 | Example 4 | Example 5 | Example 6 | Example 7 | Example 8 |
|---|---|---|---|---|---|---|---|---|
| Tg(DSC) (° C.) | 178 | 176 | 176 | 177 | 180 | 177 | 175 | 182 |
| Peeling strength (N/mm) | 1.35 | 1.34 | 1.33 | 1.32 | 1.38 | 1.34 | 1.32 | 1.35 |
| Dielectric constant (1 GHz) | 3.7 | 3.7 | 3.6 | 3.6 | 3.6 | 3.7 | 3.7 | 3.6 |
| Dielectric loss (1 GHz) | 0.0056 | 0.0052 | 0.0050 | 0.0048 | 0.0057 | 0.0053 | 0.0054 | 0.0053 |
| Combustibility | V-0 | V-0 | V-0 | V-0 | V-0 | V-0 | V-0 | V-0 |
| PCT (min) | >5 | >5 | >5 | >5 | >5 | >5 | >5 | >5 |
| PCT water absorption | 0.30 | 0.28 | 0.28 | 0.27 | 0.29 | 0.28 | 0.27 | 0.29 |
| Processability | Better | Better | Better | Better | Better | Better | Better | Better |

| Test items | Example 9 | Com. Example 1 | Com. Example 2 | Com. Example 3 | Com. Example 4 | Com. Example 5 |
|---|---|---|---|---|---|---|
| Tg(DSC) (° C.) | 178 | 178 | 178 | 174 | 180 | 176 |
| Peeling strength (N/mm) | 1.34 | 1.40 | 1.35 | 1.32 | 1.34 | 1.34 |
| Dielectric constant (1 GHz) | 3.7 | 3.9 | 3.9 | 4.0 | 4.1 | 3.7 |
| Dielectric loss (1 GHz) | 0.0054 | 0.0068 | 0.0069 | 0.0085 | 0.010 | 0.0058 |
| Combustibility | V-0 | V-0 | V-0 | V-1 | V-0 | V-0 |
| PCT (min) | >5 | >5 | >5 | >5 | >5 | >5 |
| PCT water absorption | 0.28 | 0.36 | 0.34 | 0.36 | 0.34 | 0.34 |
| Processability | Better | Better | Better | Better | Better | Worse |

It can be seen according to the data in Tables 1 and 2 that, (1) By comparing Example 1 to Comparison Example 1, it can be found that the dielectric constant, dielectric loss and water absorption of Example 1 were lower than those of Comparison Example 1, indicating that the use of synthesized dicyclopentadiene alkyl phenol epoxy resin in Example 1 can obtain a lower dielectric constant, dielectric loss and PCT water absorption than biphenyl epoxy resin used in Comparison Example 1.

(2) By comparing Example 2 to Comparison Example 2, it can be found that the glass transition temperature in Example 2 was slightly lower than that in Comparison Example 2, and the dielectric constant, dielectric loss and PCT water absorption of Example 2 were lower than those of Comparison Example 2, indicating that the use of synthesized dicyclopentadiene alkyl phenol epoxy resin in Example 2 can obtain a lower dielectric constant, dielectric loss and PCT water absorption than dicyclopentadiene epoxy resin used in Comparison Example 2.

(3) By comparing Examples 3 and 5 to Comparison Example 3, it can be found that the glass transition temperatures in Examples 3 and 5 were higher than that in Comparison Example 3, and the dielectric constant, dielectric loss, and PCT water absorption were all lower than those in Comparison Example 3; the flame retardancy thereof may achieve the V-0 level, indicating that the use of aliphatic benzoxazine and fluorinated benzoxazine in Examples 3 and 5 respectively can obtain higher glass transition temperature, lower dielectric constant, dielectric loss and PCT water absorption and higher flame retardancy than bisphenol F benzoxazine used in Comparison Example 3. According to Examples 4 and 7, it can be seen that the use of dicyclopentadiene benzoxazine and aliphatic benzoxazines can both achieve higher glass transition temperature and lower dielectric constant, wherein using aliphatic benzoxazine can achieve higher glass transition temperature and lower dielectric constant.

(4) By comparing Example 4 to Comparison Example 4, it can be seen that Example 4 can achieve a lower dielectric constant, dielectric loss, and PCT water absorption than Comparison Example 4, indicating that Example 4 can obtain a lower dielectric constant, dielectric loss, and PCT water absorption by adding a polyphenyl ether having a low molecular weight as compared to adding no such component in Comparison Example 4. By comparing Example 1 to Comparison Example 5, it can be seen that, although they had equivalent overall performances, the use of a polyphenyl ether having a high molecular weight resulted in a worse processability.

(5) By comparing Examples 1-4, it can be found that the dielectric loss and PCT water absorption of Example 1 were the highest; the dielectric loss and the PCT water absorption of Example 4 were the lowest, indicating that the dielectric constant, dielectric loss, and PCT water absorption were all reduced along with the increase of the addition amount of dicyclopentadiene alkyl phenol epoxy resin synthesized in the preparation example.

According to Examples 1 to 9, it was found that the use of dicyclopentadiene alkyl phenol epoxy resin in halogen-free resin compositions can significantly increase the dielectric properties of the substrates as compared to epoxy resins commonly used in the art. The use of styrene-maleic anhydride and benzoxazine for co-curing epoxy compositions, and the addition of a small amount of phosphorus-containing flame retardant and polyphenylene ether having a low molecular weight can improve the flame retardancy, adhesion and moisture resistance of the substrate, resulting in better overall performances, being suitable for the use in halogen-free multi-layer circuit boards, so as to have an important application value.

Certainly, the above-described examples are merely illustrative examples of the present invention and are not intended to limit the implement scope of the present invention. Therefore any equivalent changes or modifications according to the principles within the patent scope of the present invention are all included in the scope of the present patent.

The invention claimed is:

1. A resin composition free of halogen-containing flame retardants, comprising the following components in parts by weight:
50-100 parts of an epoxy resin, at least comprising an epoxy resin having the dicyclopentadiene alkyl structure as shown in the following chemical formula:

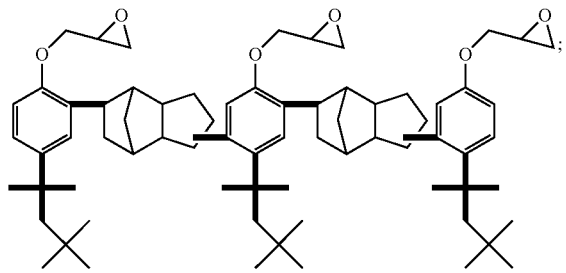

20-70 parts of benzoxazine;
5-40 parts of a polyphenyl ether, wherein the polyphenyl ether has a number-average molecular weight of 1000-4000;
5-30 parts of styrene-maleic anhydride;
5-40 parts of a halogen-free flame retardant;
0.2-5 parts of a curing accelerator; and
20-100 parts of a filler.

2. The resin composition of claim 1, wherein the epoxy resin further comprises an epoxy resin selected from the group consisting of bisphenol A type epoxy resin, bisphenol F type epoxy resin, biphenyl epoxy resin, alkyl novolac epoxy resin, dicyclopentadiene epoxy resin, bisphenol A type novolac epoxy resin, o-cresol type novolac epoxy resin, phenol type novolac epoxy resin, trifunctional epoxy resin, tetrafunctional epoxy resin, isocyanate modified epoxy resin, naphthalene type epoxy resin, phosphorus-containing epoxy resin, and a mixture of at least two of the foregoing.

3. The resin composition of claim 1, wherein the benzoxazine is selected from the group consisting of fluorinated benzoxazine resin, aliphatic benzoxazine resin, dicyclopentadiene benzoxazine resin, and a mixture of at least two of the foregoing.

4. The resin composition claimed in claim 3, wherein the fluorinated benzoxazine resin is selected from the group of the following chemical formulae, or a mixture of at least two selected therefrom:

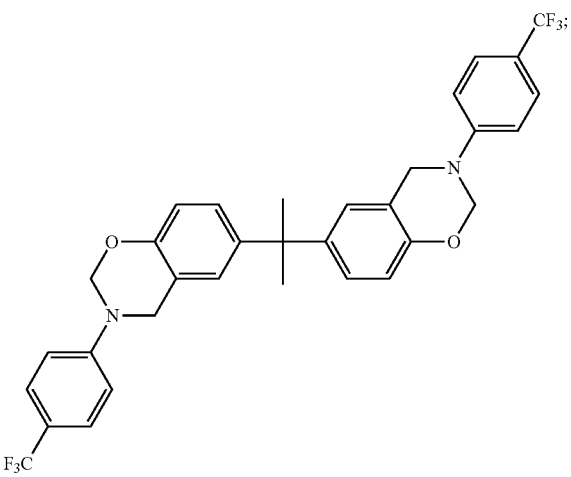

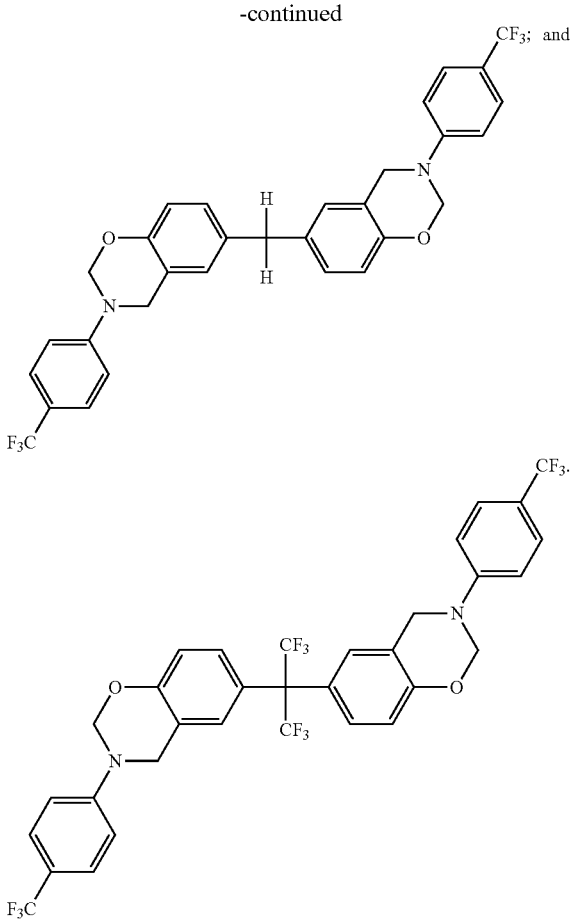

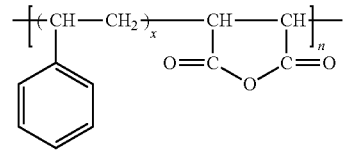

5. The resin composition of claim 3, wherein the aliphatic benzoxazine resin has the chemical structural formula of:

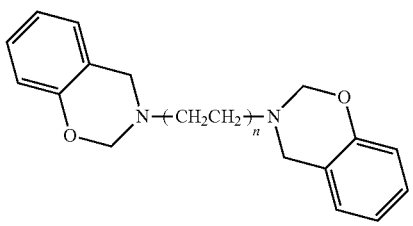

wherein n is 2 or 3.

6. The resin composition of claim 3, wherein the dicyclopentadiene benzoxazine resin has the chemical structural formula of:

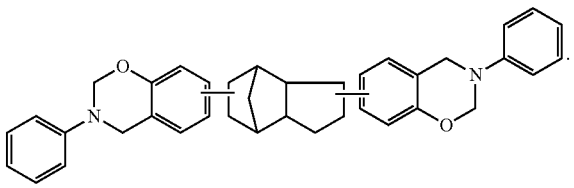

7. The resin composition of claim 1, wherein the benzoxazine is selected from the group consisting of fluorinated benzoxazine resin, aliphatic benzoxazine resin, and a mixture of at least two of the foregoing.

8. The resin composition of claim 1, wherein the styrene-maleic anhydride has the chemical structural formula of:

$$\begin{array}{c}\text{---}[\text{(CH---CH}_2\text{)}_x\text{---CH---CH}]_n\text{---}\\\text{|}\qquad\qquad\text{|}\qquad\text{|}\\\text{Ph}\qquad\text{O=C}\qquad\text{C=O}\\\qquad\qquad\backslash\text{O}/\end{array}$$

wherein x is 1-4, 6 or 8; n is 1-12; x and n both are integers.

9. The resin composition of claim 1, wherein the halogen-free flame retardant is selected from the group consisting of phosphazene, ammonium polyphosphate, tri-(2-carboxyethyl)-phosphine, tri-(isopropylchloro)phosphate, trimethyl phosphate, dimethyl-methyl phosphate, resorcinol bis-xylyl phosphate, phosphorus-nitrogen compounds, melamine polyphosphate, melamine cyanurate, tri-hydroxyethyl isocyanurate, 9,10-dihydro-9-oxa-10-phosphaphenanthrene-10-oxide, DOPO-containing novolac resin, and a mixture of at least two of the foregoing.

10. The resin composition of claim 1, wherein the curing accelerator is an imidazole accelerator.

11. The resin composition of claim 1, wherein the curing accelerator is selected from the group consisting of 2-methylimidazole, undecyl imidazole, 2-ethyl-4-methylimidazole, 2-phenyl-imidazole, 1 cyanoethyl substituted imidazole, and a mixture of at least two of the foregoing.

12. The resin composition of claim 1, wherein the filler is an inorganic or organic filler.

13. The resin composition of claim 1, wherein the filler is an inorganic filler selected from the group consisting of aluminum hydroxide, alumina, magnesium hydroxide, magnesium oxide, aluminum oxide, silicon dioxide, calcium carbonate, aluminum nitride, boron nitride, silicon carbide, titanium dioxide, zinc oxide, zirconium oxide, mica, boehmite, calcined talc, talc powder, silicon nitride, calcined kaolin, and a mixture of at least two of the foregoing.

14. The resin composition of claim 1, wherein the filler is an organic filler selected from the group consisting of polytetrafluoroethylene powder, polyphenylene sulfide, polyethersulfone powder, and a mixture of at least two of the foregoing.

15. The resin composition of claim 1, wherein the filler has a particle size of 0.01-50 μm.

16. A prepreg prepared from the resin composition of claim 1, wherein the prepreg comprises a matrix material and the resin composition attached thereon after impregnation and drying.

17. The prepreg of claim 16, wherein the matrix material is a non-woven or woven glass fiber cloth.

18. A laminate comprising the prepreg of claim 16.

19. A printed circuit board comprising the laminate of claim 18.

* * * * *